(12) United States Patent
Fettke et al.

(10) Patent No.: US 12,349,287 B2
(45) Date of Patent: Jul. 1, 2025

(54) METHOD FOR SOLDERING AN ELECTRONIC COMPONENT TO A CIRCUIT BOARD BY JETTING LIQUEFIED SOLDER INTO A THROUGH HOLE

(71) Applicant: Pac Tech—Packaging Technologies GmbH, Nauen (DE)

(72) Inventors: Matthias Fettke, Berlin (DE); Andrej Kolbasow, Paulinenaue (DE); Nico Lange, Erfurt (DE)

(73) Assignee: Pac Tech—Packaging Technologies GmbH, Nauen (DE)

( * ) Notice: Subject to any disclaimer, the term of this patent is extended or adjusted under 35 U.S.C. 154(b) by 0 days.

(21) Appl. No.: 18/677,741

(22) Filed: May 29, 2024

(65) Prior Publication Data

US 2024/0373563 A1  Nov. 7, 2024

Related U.S. Application Data

(63) Continuation of application No. 17/734,031, filed on Apr. 30, 2022, now Pat. No. 12,028,987.

(30) Foreign Application Priority Data

Apr. 30, 2021  (LU) ........................................ 102790

(51) Int. Cl.
*B23K 1/00* (2006.01)
*B23K 1/005* (2006.01)
(Continued)

(52) U.S. Cl.
CPC ......... *H05K 3/3468* (2013.01); *B23K 1/0016* (2013.01); *B23K 1/0056* (2013.01);
(Continued)

(58) Field of Classification Search
CPC .. H05K 3/3468; H05K 3/3415; H05K 3/3447; H05K 2203/041; H05K 2203/086;
(Continued)

(56) References Cited

U.S. PATENT DOCUMENTS

| | | | |
|---|---|---|---|
| 7,121,449 B2 | 10/2006 | Zakel et al. | ........... B23K 13/08 |
| | | | 228/102 |
| 10,010,958 B2 | 7/2018 | Kurtz et al. | ........... B23K 31/02 |

(Continued)

FOREIGN PATENT DOCUMENTS

| | | |
|---|---|---|
| CN | 1159130 C | 7/2004 |
| CN | 101327549 A | 12/2008 |

(Continued)

OTHER PUBLICATIONS

Search Report dated Jan. 12, 2022 from the Luxembourg Patent Office in the related foreign application LU 102790.

(Continued)

*Primary Examiner* — Kiley S Stoner
(74) *Attorney, Agent, or Firm* — Imperium Patent Works; Darien K. Wallace

(57) ABSTRACT

A method for soldering an electronic component to a circuit board involves jetting liquefied solder. A laser beam melts a solid solder ball to produce a liquefied solder ball before the ball is jetted. The liquefied solder ball is jetted towards a through hole in the circuit board such that a portion of the liquefied solder ball flows into an annular gap between a pin and sides of the through hole. The pin is attached to the electronic component and passes through the through hole. As the liquefied solder ball is jetted towards the through hole, the laser beam is directed at the ball so as to keep it liquefied. How much of the solder ball remains outside the through hole after liquefied solder has flowed into the annular gap is determined. The filling degree of the annular (Continued)

gap is determined based on how much solder remains outside the hole.

20 Claims, 10 Drawing Sheets

(51) Int. Cl.
  *B23K 31/12* (2006.01)
  *H05K 3/34* (2006.01)
  *B23K 101/42* (2006.01)
(52) U.S. Cl.
  CPC ......... *B23K 31/125* (2013.01); *H05K 3/3415* (2013.01); *H05K 3/3447* (2013.01); *B23K 2101/42* (2018.08); *H05K 2203/041* (2013.01); *H05K 2203/086* (2013.01); *H05K 2203/108* (2013.01); *H05K 2203/111* (2013.01); *H05K 2203/163* (2013.01)
(58) Field of Classification Search
  CPC ....... H05K 2203/108; H05K 2203/111; H05K 2203/163; H05K 3/306; H05K 2201/10901; H05K 2203/0195; H05K 2203/081; H05K 2203/1581; H05K 3/3478; H05K 3/3494; H05K 2203/107; H05K 3/3463; H05K 13/0465; B23K 1/0016; B23K 2101/42; B23K 1/0056; B23K 3/08; B23K 26/032; B23K 26/034; B23K 26/1464; B23K 31/125; B23K 3/06–0623; B23K 3/0638
  USPC .................. 228/179.1–180.22, 260–261, 33, 228/102–105, 8–12; 219/121.6–121.66
  See application file for complete search history.

(56) References Cited

U.S. PATENT DOCUMENTS

| 2004/0060971 | A1 | 4/2004 | Azdasht | ................. | B23K 31/02 228/256 |
| 2005/0161252 | A1 | 7/2005 | Birgel | .................... | H05K 7/18 174/260 |
| 2006/0219760 | A1 | 10/2006 | Wagoh et al. | ......... | B23K 31/00 228/248.1 |
| 2007/0075056 | A1 | 4/2007 | Ho et al. | ................ | B23K 26/00 219/121.66 |
| 2010/0302319 | A1 | 12/2010 | Akedo et al. | .......... | H05K 3/125 347/54 |
| 2011/0072655 | A1 | 3/2011 | Koyama et al. | ..... | H05K 3/3447 29/840 |
| 2013/0270230 | A1 | 10/2013 | Cheung et al. | ........ | B23K 26/00 219/121.6 |

FOREIGN PATENT DOCUMENTS

| CN | 103962721 A | 8/2014 | |
| CN | 109128546 A | 1/2019 | |
| CN | 109792844 A | 5/2019 | |
| CN | 112388098 A | 2/2021 | |
| CN | 112453621 A | 3/2021 | |
| DE | 102005043279 A1 | 3/2007 | |
| DE | 102009030249 A1 * | 1/2010 | ........... B23K 1/0016 |
| DE | 102008035405 A1 | 2/2010 | |
| DE | 202020105844 U1 | 10/2020 | |
| EP | 3153270 A1 | 12/2019 | |
| JP | 61-051750 U | 10/1987 | |
| JP | 61-055333 U | 10/1987 | |
| JP | H06 23530 A | 2/1994 | |
| JP | 2004207645 A | 7/2004 | |
| JP | 2005-046895 A | 2/2005 | |
| JP | 2006073730 A | 3/2006 | |
| JP | 2007-258209 A2 | 10/2007 | |
| JP | 2018121674 A | 8/2018 | |
| JP | 2018-176247 A | 11/2018 | |
| JP | 2020-040089 | 3/2020 | |
| JP | 2020-093296 | 6/2020 | |
| JP | 2021023987 A | 2/2021 | |
| KR | 1020150032099 A | 3/2015 | |
| KR | 101853847 B1 | 5/2018 | |
| KR | 102311872 B1 | 10/2021 | |
| KR | 20210125163 A | 10/2021 | |
| KR | 20210125166 A | 10/2021 | |
| KR | 20210125168 A | 10/2021 | |
| KR | 20210125169 A | 10/2021 | |
| KR | 20210125172 A | 10/2021 | |
| KR | 20210125174 A | 10/2021 | |
| KR | 20210125176 A | 10/2021 | |
| WO | WO 02/28588 A1 | 4/2002 | |
| WO | WO 03/079743 A2 | 9/2003 | |
| WO | WO 2008049574 A2 | 5/2008 | |

OTHER PUBLICATIONS

Office action dated Mar. 30, 2023 from the Japanese Patent Office in the related foreign application JP 2022-074872.
Final Office action dated Oct. 13, 2023 from the Japanese Patent Office in the related foreign application JP 2022-074872.

* cited by examiner

| RATIO | EQUATION | RANGE |
|---|---|---|
| RATIO OF THROUGH-HOLE DIAMETER a TO THROUGH-HOLE DEPTH b | a/b | 0.5 TO 3, PREFERABLY 1 |
| RATIO OF THROUGH-HOLE DIAMETER a TO PIN DIAMETER c | a/c | 1.5 TO 3, PREFERABLY 2 |
| RATIO OF PIN HEIGHT d ABOVE CIRCUIT BOARD TO THROUGH-HOLE DIAMETER a | d/a | 0 TO 0.5, PREFERABLY 0.5 |
| RATIO OF BASE DIAMETER e OF CONICAL FRUSTUM TO THROUGH-HOLE DIAMETER a | e/a | 1.5 TO 2 |

FIG. 10

METHOD FOR SOLDERING AN ELECTRONIC COMPONENT TO A CIRCUIT BOARD BY JETTING LIQUEFIED SOLDER INTO A THROUGH HOLE

CROSS REFERENCE TO RELATED APPLICATION

This application is a continuation of, and claims priority under 35 U.S.C. § 120 from, nonprovisional U.S. patent application Ser. No. 17/734,031 entitled "Method for Soldering an Electronic Component to a Circuit Board by Jetting Liquefied Solder into a Through Hole," filed on Apr. 30, 2022. Application Ser. No. 17/734,031, in turn, is a continuation-in-part of, and claims priority under 35 U.S.C. § 119 from Luxembourg Patent Application No. LU102790, filed on Apr. 30, 2021, in the Luxembourg Intellectual Property Office. The subject matter of each of the foregoing documents is incorporated herein by reference.

TECHNICAL FIELD

The present disclosure relates to a method and an apparatus for soldering to a circuit board having a through hole an electronic component having a pin being inserted into the through hole. The present disclosure further relates to a computer program product and a computer-readable medium.

BACKGROUND

Surface-mount technology (SMT) enables the mounting of electronic components directly onto a surface of a circuit board, such as a printed circuit board (PCB). Electronic components mounted in this manner are referred to as surface-mount devices (SMD). SMT has largely replaced through-hole technology (THT), in which a pin of a through-hole device (THD) is inserted into a through hole of the circuit board because SMT allows an increased manufacturing automation, which reduces costs and improves quality of soldering.

However, THT is still required for electronic components that are not suitable for SMT. This is the case when high mechanical strength or a heat sink is required. Exemplary electronic components are large transformers, power semi-conductors, including a heat sink (e.g., power transistors, lasers and light-emitting diodes (LED)) or connectors. In order to guarantee a sufficiently strong connection between the THD and the circuit board, an annular gap formed between the through hole and the pin inserted into the through hole needs to be filled at least by 70% with solder. In the following, a filling degree above 70% of the volume of the annular gap is also referred to as a high filling degree.

As a result, circuit boards are often packed by using SMT as well as THT. In the following, this type of circuit board is referred to as a mixed packed circuit board.

In order to create a mixed packed circuit board, WO03/079743A2 teaches to use a so-called backside-reflow method for soldering a THD with a thermally critical housing to a circuit board. In this method, a mixed packed circuit board is in particular created by pre-assembling a first side of a circuit board with SMD and THD, by turning the circuit board such that the first side of the circuit board is below the second side of the circuit board and by pre-assembling a second side of the circuit board only with SMD. The SMD are pre-assembled on the circuit board by placing the contacts thereof on respective positions on which solder paste is arranged on the circuit board. The SMD may be fixed on the circuit board by adhesive. The THD are pre-assembled by inserting a pin of the THD into a through hole on the first side such that the pin protrudes from the second side in a contact area in which solder paste is arranged. In order to avoid the THD from falling off when the circuit board is turned, the THD may be fixed to the circuit board by adhesive or soft-lock technology in which the through hole comprises a collar portion in order to hold the pin of the THD. Afterwards, the circuit board is inserted into a reflow oven and heated such that the first side of the circuit board on which the THD are mounted is at least partially shielded from heat or energy effecting the soldering.

A further development of the above method is disclosed in DE102008035405A1. In this method, the circuit board is pre-assembled on both sides with SMD and is also pre-assembled on the first side with at least one THD. Instead of adhesive or soft-lock fixture, the at least one THD is fixed to the first side of the circuit board by selectively soldering at least one pin of the THD to the circuit board before the circuit board is turned in order to pack the second side with SMD. Afterwards, the circuit board is inserted into a reflow oven in order to solder the SMD and THD to the circuit board.

Another method for producing a mixed packed circuit board is disclosed in DE102005043279A1. In this method, the circuit board is packed with only SMD and is placed in a reflow oven in order to solder the SMD to the circuit board. Afterwards, at least one THD is selectively soldered to the circuit board.

In order to selectively solder the pins of a THD to a circuit board, a solder pot is driven in three orthogonal directions, i.e., in the X-, Y- and Z-direction in a Cartesian coordinate system to contact the respective pins protruding from through holes. Furthermore, flux needs to be applied to the pins in order to avoid oxidation and to enable proper soldering. However, due to the movement in the Z-direction in order to advance and depart the solder pot to/from the pins individually, a longer time is required for soldering the THD to the circuit board compared to the solder methods using a reflow oven. EP3153270A1 thus proposes to use at least two solder pots that are each driven individually in the three orthogonal directions in order to increase the soldering speed. However, there is still the drawback that the amount of solder applied to the pin may not be controlled precisely when selectively soldering the pins of a THD to a circuit board by using a solder pot.

Therefore, it is an object of the present disclosure to overcome the drawbacks of the prior art and to provide an advanced method and apparatus for soldering to a circuit board having a through hole an electronic component having a pin being inserted into the through hole. Furthermore, the method and apparatus according to the present disclosure should also be usable for the production of mixed packed circuit boards.

SUMMARY

The invention relates to a method for soldering to a circuit board having a through hole an electronic component having a pin inserted into the through hole. The method is characterized in that a liquefied solder ball is applied, in particular jetted, onto the circuit board such that a portion of the liquefied solder ball flows into and fills an annular gap between the pin and the through hole.

A method for soldering an electronic component to a circuit board involves jetting a liquefied solder ball. A solid solder ball is supplied with energy from a laser beam so as to produce the liquefied solder ball before the liquefied solder ball is jetted. The liquefied solder ball is jetted towards a through hole in the circuit board such that a portion of the liquefied solder ball flows into an annular gap between a pin and sides of the through hole. The pin is attached to the electronic component and passes through the through hole in the circuit board. In one embodiment, the liquefied solder ball is jetted towards the through hole at an angle relative to the back surface of the circuit board; the angle is 30° to 60°. As the liquefied solder ball is jetted towards the through hole, the laser beam is directed at the liquefied solder ball so as to keep it liquefied. The liquefied solder ball is maintained in a liquefied state on the circuit board by directing the laser beam towards the through hole after the liquefied solder ball has been jetted towards the through hole. How much of the liquefied solder ball remains outside the through hole after the portion of the liquefied solder ball has flowed into the annular gap is determined. Then a filling degree of the annular gap is determined based on how much of the liquefied solder ball remains outside the through hole and on a predetermined total volume of the liquefied solder ball before the jetting.

An apparatus for soldering an electronic component to a circuit board includes a capillary, an electromechanical device, a first laser, a second laser, an infrared temperature sensor, and an image processor. The capillary constricts towards its outlet. The electromechanical device, such as a drive unit, is adapted to direct the capillary towards a through hole in the circuit board. The first laser emits a laser beam axially through the capillary. The first laser is adapted to supply energy to a solid solder ball in the capillary so as to produce a liquefied solder ball. The inner diameter of the outlet of the capillary is smaller than the diameter of the solid solder ball. The liquefied solder ball is jetted towards the through hole when a pressurized gas is supplied into the capillary. The second laser is adapted to supply energy to a pin of the electronic component that protrudes through the through hole so as to heat the pin. The first laser emits light having a wavelength that is different than that of the light emitted by the second laser. The wavelength of the light emitted by the second laser is matched to an absorption characteristic of the pin. The infrared temperature sensor is adapted to measure the temperature of the liquefied solder ball. The apparatus stops the first laser from supplying energy when the temperature of the liquefied solder ball exceeds an upper temperature threshold. The apparatus restarts the supplying of energy when the temperature of the liquefied solder ball falls below a lower temperature threshold. The image processor is adapted to determine the volume of the liquefied solder ball that remains outside the through hole after the liquefied solder ball is jetted towards the through hole and a portion flows into the through hole.

Other embodiments and advantages are described in the detailed description below. This summary does not purport to define the invention. The invention is defined by the claims.

BRIEF DESCRIPTION OF THE DRAWINGS

The accompanying drawings, where like numerals indicate like components, illustrate embodiments of the invention.

FIG. 10 is a table of ranges of ratios of dimensions that should be maintained in order to achieve the best filling of the annular gap around a pin of a through-hole device.

DETAILED DESCRIPTION

Reference will now be made in detail to some embodiments of the invention, examples of which are illustrated in the accompanying drawings.

Figure 1:
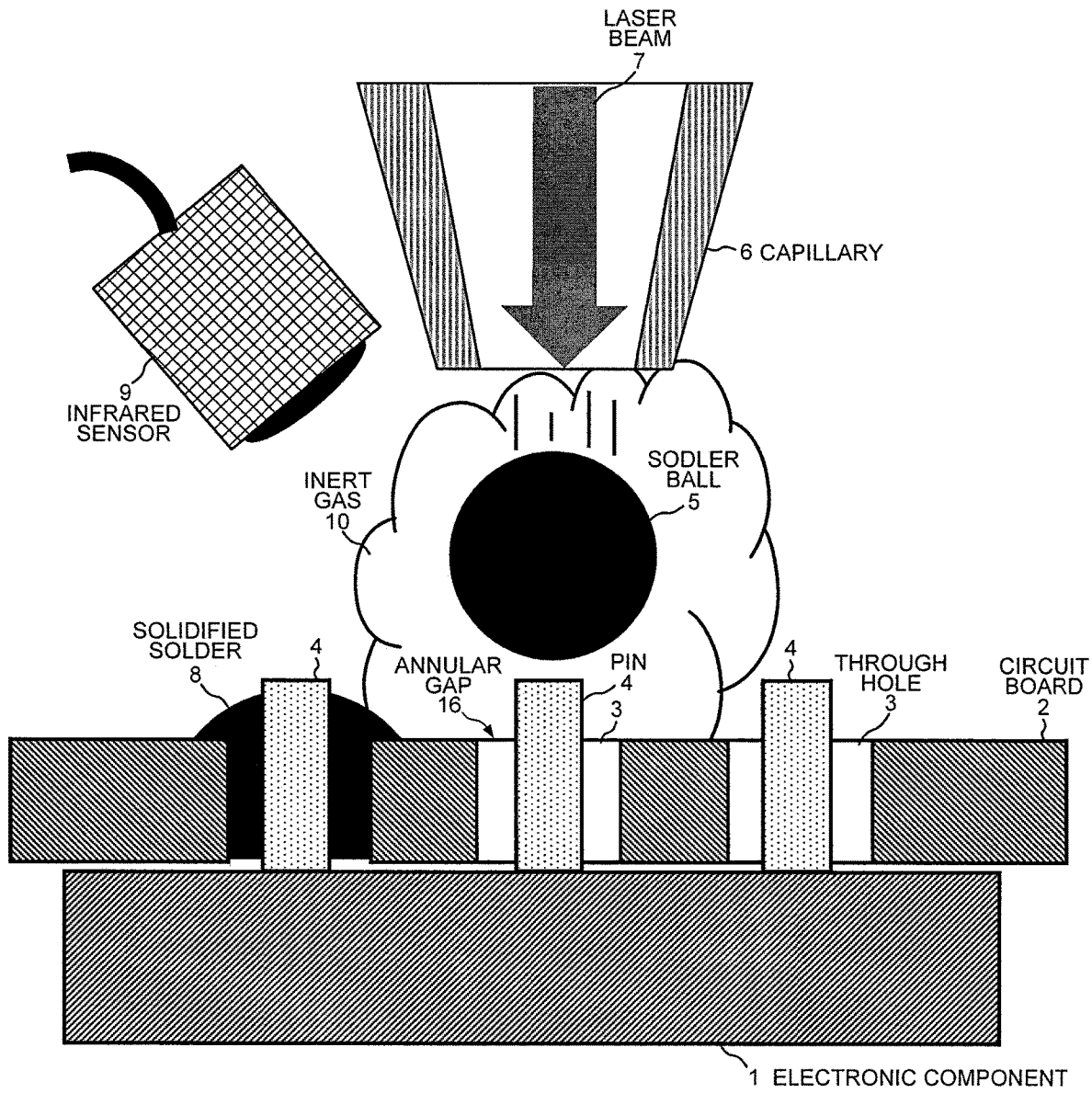
FIG. 1 schematically shows an apparatus for soldering to a circuit board having a through hole an electronic component having a pin being inserted into the through hole according to a first embodiment of the present disclosure.

FIG. 1 shows an apparatus used to implement a novel method of soldering a pin 4 of an electronic component 1 that protrudes through a through hole 3 in a circuit board 2. The method according to the disclosure solves the object of soldering the pin 4 into the through hole 3 by applying, in particular by jetting, a liquefied solder ball 5 onto the circuit board 2 comprising the through hole 3 in which the pin of the electronic component 1 is inserted such that a portion of the liquefied solder ball flows into and fills an annular gap 16 between the pin 4 and the through hole 3. As a result, the method may be used for thermally critical electronic components. In addition, it is no longer required that a solder pot has to be moved towards and away from the pin 4 which allows the required time to be reduced for soldering the electronic component 1 with the pin 4 inserted into the through hole 3 to the circuit board 2 that has the through hole 3. Moreover, by applying a liquefied solder ball 5, the amount of solder applied to the through hole 3 can be properly controlled. The liquefied solder ball 5 should fill at least 70% of the volume of the annular gap 16 in order to guarantee a proper joint of the pin 4 with the through hole 3. The volume of the solder ball should be larger than the volume of the annular gap 16 so that some solder remains outside the through hole 3 after the liquefied solder is jetted into the annular gap 16. After the liquefied solder has filled the annular gap 16, it solidifies and forms a permanent electrically conductive joint between the pin 4 and the through hole 3. As mentioned, the liquefied solder ball 5 is in particular jetted onto the circuit board 2. A method and a device for applying, in particularly jetting, a liquefied solder ball are disclosed in WO02/28588A1. The content thereof is incorporated herein by reference.

According to an aspect of the present disclosure, a ratio of the diameter of the through hole 3 and a depth of the through hole should be in the range of 0.5 to 3.0. Preferably, this ratio is 1.0. In addition, the diameter of the through hole 3 should be 1.5 times to 3.0 times the diameter of the pin 4. Preferably, the diameter of the through hole 3 should be two times the diameter of the pin 4. Furthermore, the height of the pin 4 above the back surface of the circuit board 2 should be 0 or equal to or less than 0.5 times the diameter of the through hole 3. Moreover, the diameter of a base of the solder outside the through hole 3 should be 1.5 times to 2.0 times the diameter of the through hole. Most preferably, the filling degree of the through hole 3 after soldering should be equal to or larger than 0.7 times the volume of the annular gap 16 formed between the pin 4 and the through hole 3. With the aforementioned parameters, the solder joint between the pin 4 and the through hole 3 exhibits the proper mechanical strength and forms a good electrical connection between the pin and a contact area of the through hole, which can in turn be connected to a lead on the circuit board 2.

According to an aspect of the present disclosure, after the portion of the liquefied solder ball 5 has filled the annular gap 16 and after the solder is solidified, a filling degree of the annular gap 16 is determined by measuring a volume of solidified solder outside the through hole 3 based on a predetermined total volume of the liquefied solder ball 5 before application. Preferably, the volume of the solidified solder outside the through hole 3 is measured by using three-dimensional image processing. As an example, a 3D scanner, a white-light interferometer or a light-field camera may be used for detecting the volume of solder outside the through hole 3. By subtracting the measured volume of the solidified solder outside the through hole 3 from the known volume of the solder ball before application, the volume of solder jetted into the annular gap 16 can be determined. The volume of the pin 4 above back surface of the circuit board 2 is subtracted from the volume determined by using the three-dimensional image processing in order to determine the volume of solder outside the through hole 3. Furthermore, the volumes and dimensions of the pin 4 and the through hole 3 are previously known so that a volume of the annular gap 16 can also be determined by subtracting the volume of the pin within the through hole 3 from the volume of the through hole. As a result, the filling degree of the annular gap 16 can be determined by dividing the volume of the solder jetted into the annular gap 16 by the volume of the annular gap 16. As a result, the method provides an in-situ check of the quality of the solder joint. As a consequence, the duration of a quality check of the electrically conductive joint between the pin 4 and the through hole 3 can be reduced. In contrast, the filling degree is conventionally determined by using X-ray or cross-section inspection. When using reflow soldering or wave soldering, such as a solder pot, X-ray and cross-section inspection are the only methods for determining the filling degree of the annular gap 16. As a consequence, the method according to the present disclosure provides a time-saving and cost-efficient quality check that allows more packed circuit boards to be checked such that the overall production quality can be improved.

According to an aspect of the present disclosure, the liquefied solder ball 5 can be applied onto the circuit board 2 from the back side, which is opposite the side of the circuit board on which the electronic component is arranged. As a result, the liquefied solder ball 5 can easily be applied to the spot to be soldered, i.e., the annular gap 16.

In one embodiment, the liquefied solder ball 5 is applied downwards onto the circuit board 2, and downwards is defined as the direction of gravity. As a result, the portion of the liquefied solder ball 5 that flows into the annular gap 16 is pulled by gravity such that the annular gap 16 is filled more easily to a high degree compared to the case in which the liquefied solder ball 5 is applied upwards, e.g., by using a solder pot.

In another embodiment, the liquefied solder ball 5 is applied at an oblique angle onto the circuit board 2. This means that the application direction of the liquefied solder ball 5 is inclined with respect to the circuit board 2, i.e., the back surface of the circuit board. Preferably, the oblique angle is in the range of 30° to 60° with respect to the circuit board 2. More preferably, the oblique angle is substantially 45° with respect to the circuit board 2. As a result, the liquefied solder ball 5 is easily applied to the through hole 3 so that the annular gap 16 is filled properly. Furthermore, the length of a pin that is soldered using the novel method can vary because the length of the pin is not limited by the height of a solder wave or the depth of a solder pot. In contrast to using a solder pot, solder does not have to be applied to a tip of the pin such that solder material can be saved. In particular, the liquefied solder ball 5 can be applied in an oblique angle when a pin with a tip is used. In this way, a reflection of a laser beam from the tip can be avoided. In addition, spattering of the liquefied solder ball 5 can be avoided by applying the liquefied solder ball in an oblique angle when using a pin with a tip.

Figure 5:
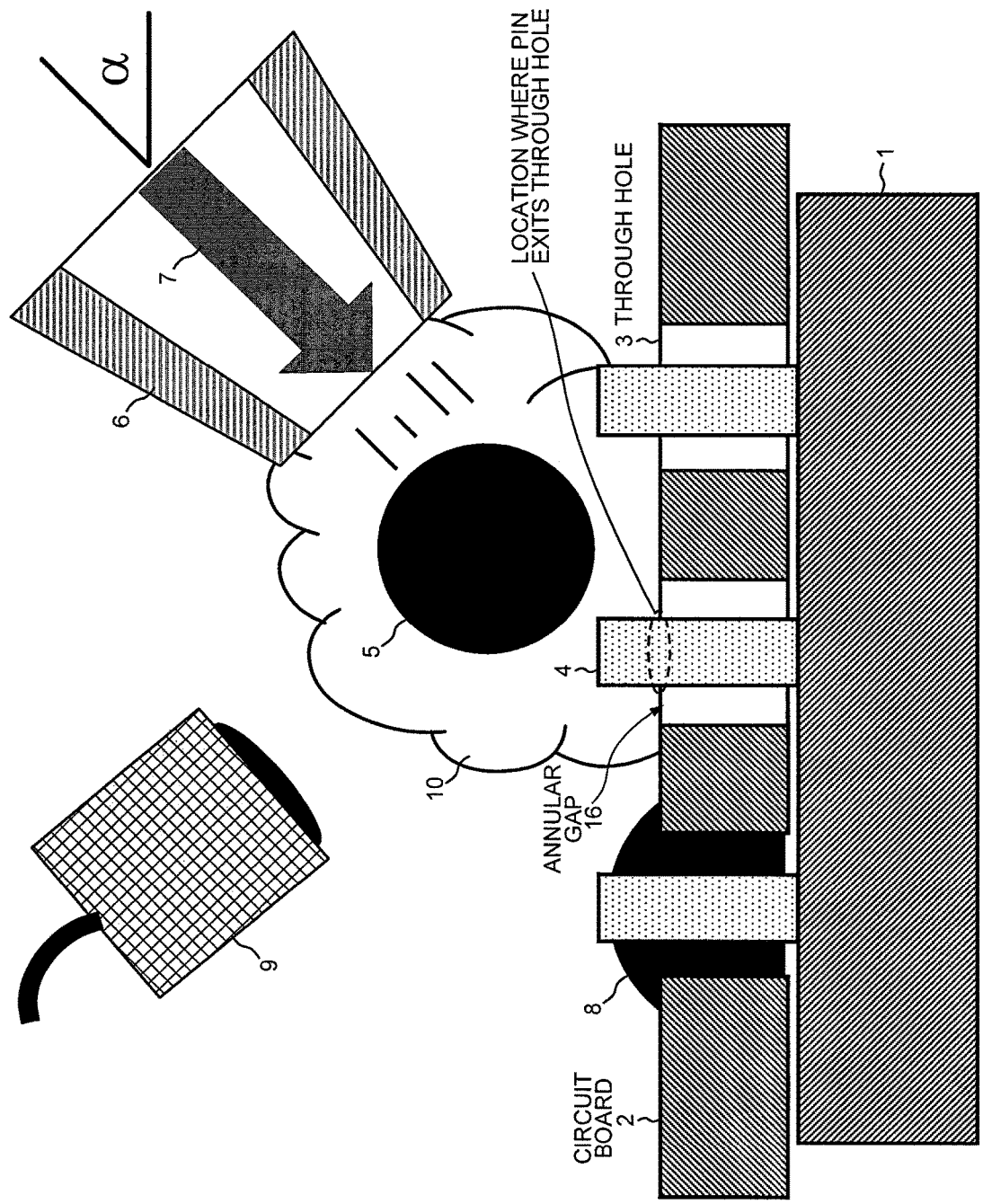
FIG. 5 schematically shows an apparatus according to a third embodiment of the present disclosure in which a capillary is inclined with respect to the circuit board.

According to an aspect of the present disclosure, the application direction of the liquefied solder ball 5 is directed to the through hole 3. Preferably, the application direction is directed to a spot where the pin 4 exits the through hole 3, as illustrated in FIG. 5. As a result, the liquefied solder ball 5 is applied properly so that a high filling degree of the annular gap 16 can be achieved.

According to an aspect of the present disclosure, a solid solder ball is supplied with energy before applying the liquefied solder ball 5 in order to produce the liquefied solder ball. As a result, the volume of solder that is applied to the circuit board 2, i.e., to the annular gap 16, is previously known, and a high filling degree of the annular gap 16 can be achieved by choosing an appropriate volume of the solid solder ball with respect to the volume of the annular gap 16.

According to an aspect of the present disclosure, the energy can be supplied via a laser beam. Preferably, the laser beam is a near-infrared (NIR) laser beam, which is adapted to provide power in the range of 200 W to 400 W NIR. Preferably, the laser beam is supplied for a time period in the range of 20 ms to 4000 ms. As a result, it is ensured that the liquefied solder ball 5 is sufficiently liquefied such that a portion of the liquefied solder ball properly flows into and fills the annular gap 16 in order to achieve a proper joint.

According to an aspect of the present disclosure, the laser beam is supplied when the liquefied solder ball 5 is applied, in particular jetted, towards the circuit board 2. More specifically, the laser beam is applied to the liquefied solder ball 5 during the flight of the solder ball towards the circuit board 2. As a result, the liquidation of the solder ball can be maintained.

According to an aspect of the present disclosure, the laser beam can be permanently or intermittently supplied to the solid solder ball 8 or the liquefied solder ball 5. As a result, the liquidation of the solder ball can be achieved and maintained.

According to an aspect of the present disclosure, the laser beam can be applied to the liquefied solder ball 5 when the liquefied solder ball has arrived on the circuit board 2, i.e., on the surface of the circuit board, in order to keep it liquefied. The time of arrival can be calculated in advance from the jetting speed and the distance from which the liquefied solder ball 5 is applied or may be determined by means of image processing or experimentally. As a result, it can be assured that the portion of the liquefied solder ball 5 properly flows into and fills the annular gap 16.

According to an aspect of the present disclosure, the temperature of the solder ball is measured while the energy is being supplied. Preferably, the supply of energy, i.e., the supply of the laser beam, is stopped when the temperature of the solid or liquefied solder ball exceeds a predetermined temperature threshold. Preferably, the supply of energy, i.e., the laser beam, is started or restarted when the temperature of the liquefied solder ball 5 falls below a predetermined lower temperature threshold. As a result, it can be avoided that the solder is burned or that the solder solidifies. Therefore, it is assured that the correct portion of the liquefied solder ball 5 flows into and fills the annular gap 16 such that a proper joint between the pin 4 and the through hole 3 is achieved.

According to an aspect of the present disclosure, the solid solder ball 8 has a diameter in the range of 0.8 mm to 2.0 mm. Preferably, the solder ball has a diameter in the range of 0.8 to 1.4 of the diameter of the through hole 3. As a result, a high filling degree of the annular gap 16 can be achieved.

According to an optional aspect of the present disclosure, flux can be applied to the through hole 3 before applying the liquefied solder ball 5. As mentioned above, the application of flux is not explicitly required but may provide a positive effect with respect to the oxidation of the solder, the pin 4 and the through hole 3. Therefore, a proper joint of the pin 4 and the through hole 3 can be achieved.

According to an aspect of the present disclosure, the flux can be activated before application of the liquefied solder ball 5. In particular, the flux can be activated by heating it to a temperature between 60° C. and 130° C. Preferably, the flux can be activated by supplying energy wherein more preferably the energy supplied is the laser beam. As a result, the joint between the pin 4 and the through hole 3 can be influenced positively.

According to an aspect of the present disclosure, before applying the liquefied solder ball 5, the circuit board 2 is heated to a temperature in the range of 60° C. to 90° C. As a result, the liquefied solder ball 5 is not cooled down strongly after arriving at the surface of the circuit board 2 and, thus, the liquefied solder ball stays sufficiently liquefied such that it properly flows into and fills the annular gap 16. A high filling degree of the annular gap 16 can thereby be achieved.

According to an aspect of the present disclosure, the pin 4 is heated before jetting the liquefied solder ball 5. Preferably, the pin 4 is heated by directing the laser beam towards the pin. More preferably, a pin heating laser beam with light having a wavelength adapted to a absorption characteristic of the pin 4, i.e., the material from which the pin is made, is directed towards the pin. In particular, the pin heating laser beam is a blue laser beam. For example, the light of the pin heating laser beam can have a wavelength in the range of 450 nm to 475 nm, in particular 450 nm. In this way, solidification of the liquefied solder ball 5 can be delayed when it arrives at the pin 4 such that the correct portion of the liquefied solder ball properly flows into and fills the annular gap 16. As a result, a high filling degree of the annular gap 16 and, thus, a proper joint between the pin 4 and the through hole 3 can be achieved.

According to an additional aspect of the disclosure, the temperature of the pin 4 is measured during heating. In case the temperature of the pin 4 exceeds a predetermined temperature threshold, the heating of the pin is stopped. In this way, overheating of the pin 4 or the electronic component 1, which is connected to the pin, is avoided.

According to a further aspect of the disclosure, the duration for heating the pin 4 may be predetermined. For example, the duration may be determined in advance by carrying out experiments. In this way, overheating of the pin 4 or the electronic component 1 connected to the pin can be avoided.

According to an aspect of the present disclosure, inert gas can be passively or actively applied to the through hole 3. The inert gas may be nitrogen, argon, helium or formid gas. As a result, the oxidation of the solder is avoided such that the soldering of the pin 4 to the through hole 3 is positively influenced.

According to an aspect of the present disclosure, the electronic component 1 and the circuit board 2 are separated from each other such that a gas exhaust passage is formed between the electronic component 1 and the circuit board 2. This may be achieved by holding the electronic component 1 and the circuit board 2 in a separated manner or by arranging spacers between the electronic component and the circuit board. As a result, gas, for example the inert gas or air, present within the annular gap 16 may exhaust from an opening of the through hole 3 on the side, which is opposite to the side from which the liquefied solder ball 5 is applied onto the circuit board 2. Therefore, the correct portion of the liquefied solder ball 5 may flow into and fill the annular gap 16 more easily in order to achieve a high filling degree.

A computer program product according to the present disclosure comprises instructions for carrying out the method according to the present disclosure. As a result, the instructions cause a computer or a control unit to execute the method according to the present disclosure.

A computer-readable medium according to the present disclosure stores the computer program product according to the present disclosure. As a result, a CPU of the computer or the control unit can read the instructions from the computer-readable medium in order to execute the steps of the method according to the present disclosure.

An apparatus for soldering to a circuit board 2 having a through hole 3 an electronic component 1 having a pin 4 inserted into the through hole 3 comprises a solder ball applying device for applying, in particular jetting, a liquefied solder ball 5 onto the circuit board 2 such that a portion of the liquefied solder ball 5 flows into and fills an annular gap 16 between the pin 4 and the through hole 3. A device for applying, in particularly jetting, a solder ball is disclosed in WO02/28588A1. The content thereof is incorporated by reference herein. In particular, the solder ball applying device comprises a capillary 6 movable with respect to the circuit board 2, i.e., the annular gap 16, and a pressure gas source for supplying pressure gas into the capillary in order to apply, in particular jet, the liquefied solder ball 5 onto the circuit board 2. By using the above solder ball applying device, it is not necessary to move the capillary 6 towards and away from the pin 4 and the through hole 3 so that the speed of the soldering process can be increased.

According to an aspect of the present disclosure, the apparatus can comprise a control unit and a drive unit for controlling and driving the solder ball applying device. The control unit includes a CPU, a memory and an input/output unit. The memory includes the computer-readable medium that stores the computer program product comprising the instructions for carrying out the method according to the present disclosure. The drive unit is an electromechanical device for positioning the capillary 6 of the solder ball applying device with respect to the circuit board 2, i.e., with respect to the annular gap 16.

According to an aspect of the present disclosure, the capillary 6 constricts towards its outlet opening such that an inner diameter of the capillary is smaller than a diameter of a solid solder ball, which is used to produce the liquefied solder ball 5. As a result, the solid solder ball 8 is prevented from falling out of the capillary 6.

According to an aspect of the present disclosure, the capillary 6 can be inclined with respect to a surface of the circuit board 2. The capillary 6 can be inclined by a fixed angle or by a variable angle, which may be set by using the drive unit. As a result, the liquefied solder ball 5 can be applied to the circuit board 2 easily.

According to an aspect of the present disclosure, the apparatus can comprise an energy supply unit for supplying energy to the solid solder ball in order to produce the liquefied solder ball 5. As a result, the solid solder ball can be sufficiently liquefied to be jetted out of the tapered capillary 6 when the pressure gas is supplied into the capillary.

According to a preferred aspect of the present disclosure, the energy supply unit can be a laser beam, i.e., a laser source. Preferably, the laser beam is a near infrared laser beam that provides 200 W to 400 W NIR. More preferably, the laser beam is adapted to be supplied permanently or intermittently. The power and duration of the laser beam is controlled by the control unit, and the laser beam is guided axially through the capillary 6 such that it points in the same direction as the capillary. As a result, the laser beam can be appropriately applied to the solid solder ball 8 in order to produce the liquefied solder ball 5 and may also be used to keep the liquefied solder ball sufficiently liquefied. As the laser beam is directed in the same direction as the capillary 6, the laser beam still reaches the liquefied solder ball 5 after it is jetted out of the capillary 6. Therefore, the laser beam can be applied to the liquefied solder ball 5 during a flight from the capillary 6 to the circuit board 2 or after the liquefied solder ball has arrived on the circuit board. As a result, it can be ensured that the portion of the liquefied solder ball 5 flows properly into the annular gap 16 such that a high filling degree can be achieved.

According to an aspect of the present disclosure, the apparatus includes a temperature measuring unit for measuring the temperature of the liquefied solder ball 5 or the solid solder ball 8. Preferably, the temperature measuring unit includes an infrared sensor, optionally an optical infrared sensor. As a result, the temperature can be transmitted from the temperature measuring unit to the control unit, and the energy supply unit, in particular the laser beam, can be controlled appropriately in order to avoid burning of the liquefied solder ball 5 or to avoid solidification of the liquefied solder ball before it flows into and fills the annular gap 16.

According to an aspect of the present disclosure, the apparatus includes a holding unit for holding the circuit board 2 and the electronic component 1 such that the pin 4 of the electronic component is inserted into the through hole 3 of the circuit board 2. Preferably, the holding unit grabs the electronic component 1 and the circuit board 2 individually and inserts the pin 4 of the electronic component 1 into the through hole 3. In particular, the holding unit is adapted to hold the electronic component 1 and the circuit board 2 such that the electronic component is disposed on a first side of the circuit board, and the liquefied solder ball 5 is applied from a second side, which is opposite to the first side. More preferably, the holding unit is adapted to hold the electronic component 1 and the circuit board 2 such that the liquefied solder ball 5 is applied downwards. Alternatively, the holding unit is adapted to hold a circuit board on which the electronic component is pre-assembled.

According to an aspect of the present disclosure, the apparatus includes a volume measuring unit for measuring a volume of solidified solder outside the through hole 3. Preferably, the volume measuring unit includes a three-dimensional detection device, such as a 3D scanner, and the control unit, which receives captured images and executes three-dimensional image processing in order to determine the volume of solidified solder outside the through hole 3. Alternatively, a white-light interferometer or a light-field camera may be used as the three-dimensional detection device. As a result, the volume of solidified solder that is jetted into the annular gap 16 is determined by subtracting the measured volume of solidified solder outside the through hole 3 from the total volume of the solid solder ball 8. The volume of the pin 4 above the circuit board 2 should be subtracted from the volume determined by using the three-dimensional image processing in order to determine the volume of solder outside the through hole 3. As the dimensions and volumes of the pin 4 and the through hole 3 are known, the volume of the annular gap 16 can be calculated. Afterwards, a filling degree of the annular gap 16 is determined by dividing the volume of liquefied solder jetted into the annular gap 16 by the volume of the annular gap 16. The aforementioned calculations can be performed by the control unit. Hence, the apparatus according to the present disclosure performs an in-situ check of the filing degree of the annular gap 16 without the need of X-ray inspection or cross-section inspection. As a consequence, the time required for checking the quality of each solder joint can be reduced.

According to an optional aspect of the present disclosure, the apparatus can include a flux applying unit for applying flux to the pin 4 and through hole 3. As a result, oxidation of the pin 4 and the through hole 3 can be avoided in order to enable a proper joint between the pin 4 and the through hole 3.

According to a preferred aspect of the present disclosure, the energy supply unit, in particular the laser beam, can be used to activate the flux, in particular by heating the flux to a temperature up to 60° C. to 130° C. As a result, the soldering process can be influenced positively.

According to preferred aspect of the present disclosure, the apparatus can include a circuit board heating unit for heating the circuit board 2, in particular to a temperature of 60° C. to 90° C. The circuit board heating unit can supply warm air or can be warm parts contacting the circuit board 2. The warm parts contacting the circuit board 2 are preferably included in the holding unit. As a result, it is avoided that the liquefied solder ball 5 is cooled down when arriving at the surface of the circuit board 2. As a consequence, it is assured that the portion of the liquefied solder ball 5 properly flows into and fills the annular gap 16.

According to an aspect of the present disclosure, the apparatus can include a pin heating unit for heating the pin 4. The pin heating unit can be the aforementioned laser beam, which is used to liquefy the solid solder ball. In order to heat the pin 4, the laser beam can be directed axially through the capillary 6 towards the pin 4 and switched on when no solid solder ball is placed in the capillary. Preferably, the pin heating unit can be a pin heating laser beam, which is able to emit light having a wavelength that is adapted to an absorption characteristic of the pin 4, i.e., the material of the pin. It was found that a blue laser, for example a laser with a wavelength in the range of 450 nm to 475 nm, in particular 450 nm, is best suited for heating the pin. As a result, the solidification of the liquefied solder ball 5 is delayed when it arrives at the pin 4 such that the portion of the liquefied solder ball properly flows into and fills the annular gap 16.

According to an additional aspect of the present disclosure, the temperature measuring unit is adapted to measure the temperature of the pin 4 during heating. A temperature threshold for the pin 4 may be predetermined and stored in the control unit. The control unit is adapted to compare the temperature threshold with the temperature value acquired from the temperature measuring unit. In case the control unit receives a temperature value from the temperature measuring unit that exceeds the temperature threshold, the control unit stops the heating of the pin 4 by switching off the laser beam or the pin heating laser beam.

According to a further aspect of the disclosure, the duration during which the pin 4 is heated is determined in advance. The duration may be for example determined by experiments. In this way, overheating of the pin 4 or the electronic component 1 connected to the pin can be avoided.

According to an aspect of the present disclosure, the apparatus can include an inert gas supplying unit for actively of passively supplying inert gas to the through hole 3 and the pin 4. According to an alternative aspect, the apparatus can be placed in a chamber or container including an inert gas atmosphere. As a result, oxidation of the liquefied solder is avoided so that the soldering process is positively influenced.

According to an aspect of the present disclosure, the holding unit can be adapted to hold the circuit board 2 and the electronic component such that the electronic component and the circuit board are distanced from each other such that a gas exhaust passage is formed between the electronic component 1 and the circuit board 2. As a result, gas present inside the annular gap 16, i.e., the inert gas or air, can exit the annular gap 16 so as to reduce the resistance towards the liquefied solder ball 5 when it arrives at the circuit board 2 and flows into and fills the annular gap 16. A high filling degree of the annular gap 16 can thereby be achieved.

FIG. 1 shows an apparatus for soldering an electronic component 1 having a pin 4 to a circuit board 2 having a through hole 3 in which the pin 4 of the electronic component 1 is inserted according to a first embodiment of the present disclosure. The electronic component 1 thus corresponds to a though-hole device (THD). In the embodiment of FIG. 1, three pins 4 of the electronic component 1 protrude substantially orthogonal from a surface of the electronic component 1, i.e., from a surface of a housing of the electronic component 1, in an upward direction. The pins 4 are inserted into three respective through holes 3 formed in the circuit board 2 from a first side, i.e., the lower side in FIG. 1, of the circuit board 2 such that the pins 4 protrude from a second side or back side, i.e., the upper side in FIG. 1, of the circuit board 2 that is opposite to the first side. It needs to be noted that the present disclosure is not limited to three pins 4, and the electronic component 1 may comprise at least one pin, two pins or more than three pins. Moreover, the pins 4 may be inclined with respect to the surface of the electronic component 1 from which they protrude, and the pins 4 may comprise a bent structure. Similarly, the circuit board 2 may comprise a number of through holes 3, which corresponds to at least the number of pins 4 of the electronic component 1. Moreover, the through holes 3 are arranged on the circuit board 2 such that their positions correspond to the positions of the pins 4 on the electronic component 1.

The pins 4 are joined to the through holes 3 by jetting a liquefied solder ball 5 onto the circuit board 2 such that a portion of the liquefied solder ball 5 flows into and fills an annular gap 16 that is formed between the pin 4 and the through hole 3. After the portion of the liquefied solder ball 5 is jetted into the annular gap 16, it solidifies due to an environmental temperature that is below the melting point of the solder. Thus, an electrically conductive joint between the pin 4 and the through hole 3 and, thus, between the pin 4 and a lead of the circuit board 2 that is connected to the through hole 3 is formed.

In the embodiment shown in FIG. 1, the liquefied solder ball 5 is produced and jetted by using a solder ball applying device that includes a capillary 6 that is funnel shaped towards the opening of the capillary 6. In particular, the diameter of the opening of the capillary 6 is smaller than the diameter of a solid solder ball 8 (not shown) which is used to produce the liquefied solder ball 5. As a result, the solid solder ball 8 is held at a position where the diameter of the tapered capillary 6 that constricts towards its outlet corresponds to the diameter of the solid solder ball.

In order to jet the liquefied solder ball 5 towards the spot to be soldered, i.e., the annular gap 16, pressure is applied to the capillary 6 by a pressure gas source, and a laser beam 7 from a laser source is supplied as a form of energy to the solid solder ball 8 in order to produce the liquefied solder ball 5. For this reason, the laser beam 7 is guided through the capillary 6, as shown in FIG. 1. When the solid solder ball is sufficiently liquefied, the liquefied solder ball 5 is deformed such that it can exit the capillary 6 and is jetted out of the capillary 6 towards the circuit board 2, i.e., the annular gap 16, due to the pressure inside the capillary 6. As a result, the capillary 6 does not need to be advanced towards or moved away from the circuit board 2 in order to apply the liquefied solder ball 5. In FIG. 1, the capillary 6 is directed exactly towards a tip of the pin 4, but it is also possible for the capillary 6 to be directed to a spot beside the pin 4 within the circumference of the through hole 3.

In order to control and move the capillary 6 and to control the laser beam 7, i.e., the power and duration of the application of the laser beam 7, and the gas pressure source, the apparatus includes a control unit and a drive unit (not shown). The control unit is implemented by a computer including a CPU, a memory, as well as an input/output unit. The memory stores a control program that is executed by the CPU and that includes instructions to carry out the method according to the present disclosure. The drive unit is implemented by electromechanical drives for driving the capillary 6 and other units of the apparatus, e.g., a holding unit (not shown) for holding the electronic component 1 and/or the circuit board 2.

In the embodiment shown in FIG. 1, the liquefied solder ball 5 is jetted onto the circuit board 2 from the second side, which is opposite to the first side on which the electronic component 1 is mounted. In FIG. 1, the liquefied solder ball 5 is jetted downwards. It needs to be noted that downwards is defined as the direction of gravity within this specification. This arrangement provides the advantage that the through hole 3 may be easily reached by the liquefied solder ball 5 and that the portion of the liquefied solder ball 5 that flows into the annular gap 16 between the pin 4 and the through hole 3 is supported by gravity. As a result, the filling degree of the annular gap 16 with solder can be increased compared to jetting the liquefied solder ball 5 upwards. In order to avoid the electronic component 1 from falling off the circuit board 2, the apparatus includes a holding unit (not shown) for holding at least the electronic component 1 and the circuit board 2. The holding unit may be adapted to hold multiple electronic components 1 and the circuit board 2 individually. Alternatively, the electronic component 1 and the circuit board 2 may be pre-assembled by using adhesive, and the holding unit is adapted to hold only the circuit board 2.

Supplying the laser beam 7 is not limited to the situation in which the liquefied solder ball 5 is within the capillary 6; the laser beam 7 can also be applied permanently or intermittently after the liquefied solder ball 5 is jetted out of the capillary 6 in order to ensure that the liquefied solder ball 5 stays sufficiently liquefied. The laser beam 7 is especially supplied when the liquefied solder ball 5 flies from the capillary 6 towards the surface of the circuit board 2 in order to guarantee that the liquefied solder ball 5 is still liquefied when it arrives on the circuit board 2.

In addition, an infrared sensor 9 is used to measure the temperature of the liquefied solder ball 5. The infrared sensor 9 thus corresponds to a temperature measuring unit, and the infrared sensor 9 is communicatively connected to the control unit and transmits the measured temperature of the liquefied solder ball 5 to the control unit. As a result, the laser beam 7 can be controlled by the control unit such that the temperature of the liquefied solder ball 5 is maintained within a predefined temperature range defined by an upper temperature threshold and a lower temperature threshold. In case the temperature of the liquefied solder ball 5 becomes higher than the upper temperature threshold, the supply of the laser beam 7 is stopped, or the power of the laser beam 7 is set to a lower value. Hence, it can be avoided that the liquefied solder is burned. Similarly, in case the temperature of the liquefied solder becomes lower than the lower temperature threshold, the laser beam 7 is resupplied to the liquefied solder ball 5 or the power of the laser beam can be set to a higher value. In this way, it can be ensured that the liquefied solder ball 5 is sufficiently liquefied such that a portion thereof flows properly into the annular gap 16. Therefore, a proper joint between the pin 4 and the through hole 3 can be assured.

According to the present disclosure, inert gas 10 is applied to the spot to be soldered, i.e., to the through hole 3 and the pin 4. This can be done by actively applying the inert gas 10, for example by supplying the inert gas by means of the capillary 6, which is connected with an inert gas source. The capillary 6 thus corresponds to an inert gas supplying unit. However, the apparatus may comprise an inert gas supplying unit that is provided separately from the capillary 6, such as a separate nozzle. In another embodiment, the inert gas 10 may be applied passively by placing the apparatus for soldering the pin 4 to the through hole 3 in a closed environment filled with the inert gas 10. As a result, oxidation of the solder, the pin 4 and/or the through hole 3 can be avoided and the soldering process is positively influenced.

After the liquefied solder ball 5 has arrived at the circuit board 2, it flows into and fills the annular gap 16 between the pin 4 and the through hole 3. In order to enable that the portion of the liquefied solder ball 5 flows appropriately into the annular gap 16, the circuit board 2 may be heated so that solidification of the liquefied solder ball 5 is prevented when it arrives at the circuit board 2. The circuit board 2 may be heated by using a circuit board heating unit, such as a blower supplying heated air or parts contacting the circuit board 2. Preferably, the circuit board heating unit contacting the circuit board 2 is included in the holding unit for holding the electronic component 1 and the circuit board 2.

FIG. 1 shows an annular gap 16 towards the left that is already filled with solidified solder 8. In the present embodiment, the volume of the solid solder ball, and thus the liquefied solder ball 5, is larger than the volume of the annular gap 16 and, thus, not all of the solder flows into the annular gap 16. As a result, a portion of the liquefied solder ball 5 flows into the annular gap 16 and fills it, and the other portion of the liquefied solder ball remains outside the through hole.

The apparatus according to the present disclosure provides the additional benefit that a SMD (surface-mount device) arranged on the first side can be soldered to the circuit board by using the solder ball applying device, and then the circuit board may be turned and a THD, i.e., the electronic component 1 having the pin 4 being inserted into the through hole 3 of the circuit board 2, can be soldered to the circuit board 2 as described above.

More preferably, at least one THD is arranged on the first side such that the pins protrude from the second side, and the liquefied solder ball 5 is applied from the second side. In addition, SMDs are arranged on the second side, i.e., the upper side of the circuit board 2, and are also soldered to the circuit board 2. Afterwards, the circuit board 2 is turned such that the first side is above the second side, and a THT device is arranged on the second side such that the pins 4 protrude from the first side. The liquefied solder ball 5 is then applied on the first side in order to solder the pin 4 to the through hole 3. In addition, SMDs are arranged on the first side and are also soldered to the circuit board by using a liquefied solder ball 5. In this way, a mixed packed circuit board with electronic components, i.e., SMDs and THDs, on both sides of the circuit board may easily be produced without using a second soldering method, such as reflow soldering or selective soldering.

Figure 2:
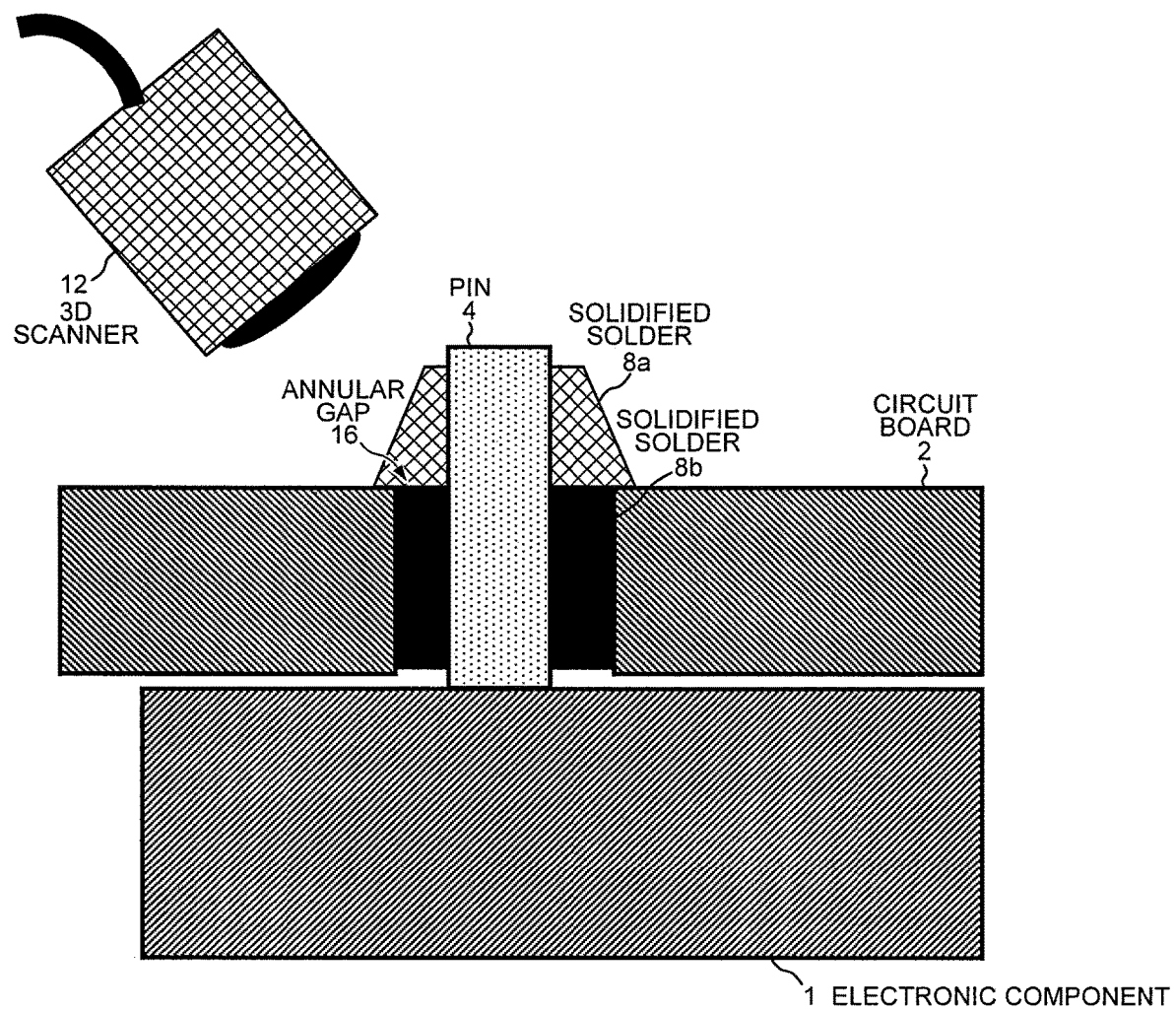
FIG. 2 schematically shows an apparatus according to a second embodiment of the present disclosure comprising a 3D scanner as a three-dimensional detection device for measuring a volume of solidified solder outside the through hole in order to determine the filling degree of an annular gap between the pin and the through hole.

FIG. 2 shows an apparatus according to a second embodiment of the present disclosure, which includes a 3D scanner 12 as a three-dimensional detection device. In the present embodiment, the volume of the solidified solder 8a outside the through hole 3 is measured by using three-dimensional image processing. It is to be noted that an image processing method for three-dimensional reconstruction which is known in the prior art may be used in the present disclosure. The 3D scanner 12 may be included in the same housing as the infrared sensor 9 or may be provided separately. The 3D scanner 12 is connected to the control unit and the image processing for determining the volume of the solidified solder 8b inside the through hole is executed in the control unit. The 3D scanner 12 and the control unit, thus, correspond to a volume measuring unit. It is to be noted that the three-dimensional image processing may also be performed by a computer different from the control unit.

Furthermore, FIG. 2 shows an annular gap 16 filled with solidified solder 8 in detail. As mentioned above, the volume of the liquefied solder ball 5 is preferably larger than the volume of the annular gap 16. In the present disclosure, the filling degree of the annular gap 16 must be at least 70% in order to guarantee a proper electrical and mechanical joint of the pin 4 and the through hole 3.

As a predetermined volume of solder, i.e., the volume of the liquefied solder ball 5, which corresponds the volume of the solid solder ball, is applied to the circuit board 2 according to the present disclosure, a filling degree of the annular gap 16 can be determined by measuring a volume of solidified solder 8a outside the through hole 3.

In order to determine the filling degree, the control unit can be configured to perform the following processes. The measured volume of the solidified solder 8a is compared to the total volume of the liquefied solder ball 5 before application in order to determine the volume of solder 8b that is jetted and solidified in the annular gap 16. In this respect, it needs to be noted that the volume of the pin 4 outside the through hole 3 needs to be taken into account when determining the volume of the solder 8a outside the through hole 3. The dimensions of the pin 4 and the through hole 3 are previously known, for example from specifications of the electronic component 1 and the circuit board 2. Hence, a volume of the annular gap 16 can also be determined by subtracting the volume of the pin 4 inside the through hole 3 from the volume of the through hole 3. The volume of the solidified solder 8b inside the annular gap 16 is then divided by the volume of the annular gap 16 in order to determine the filling degree. In case some of the solder flows out of an opening of the through hole on the lower side, the determined volume of the solidified solder 8b is even greater than the volume of the annular gap 16. In this case, it is determined that the filling degree is 100%.

The results of the determined volumes, the filling degree as well as the captured images are stored in the memory of the control unit. As a result, the present disclosure enables to in-situ check the quality of the solder joint by determining the filling degree of the annular gap 16 without using X-ray inspection or cross-section inspection.

Figure 3:
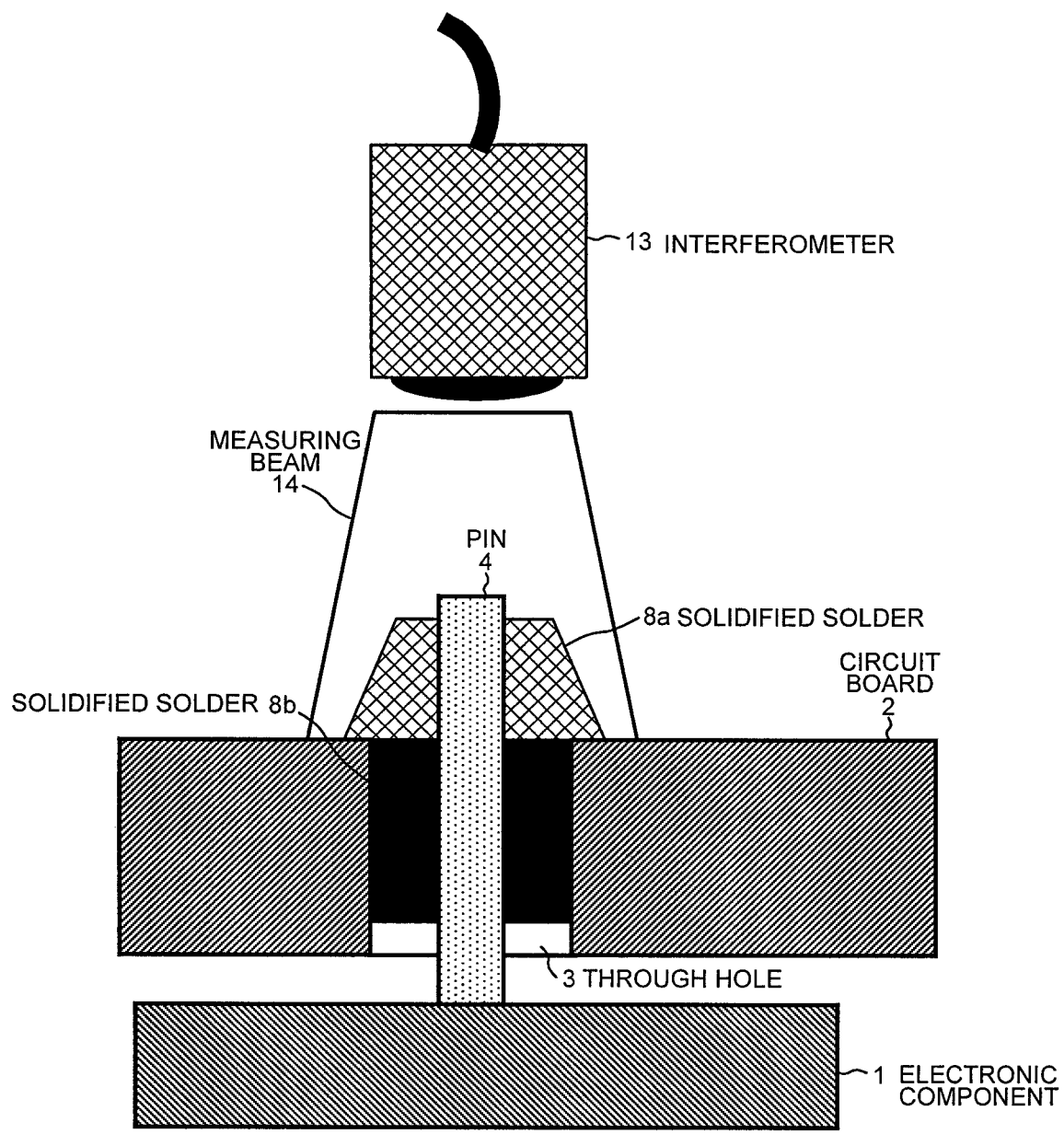
FIG. 3 schematically shows a modification of the apparatus according to the second embodiment, which comprises as the three-dimensional detection device an interferometer emitting a measuring beam.

FIG. 3 shows a modification of the second embodiment in which an interferometer 13 emitting a measuring beam 14 is used as the three-dimensional detection device in order to detect the volume of the solidified solder 8a outside the through hole 3 such that a filling degree can be determined. Consequently, the interferometer 13 and the control unit correspond to the volume measuring unit.

Figure 4:
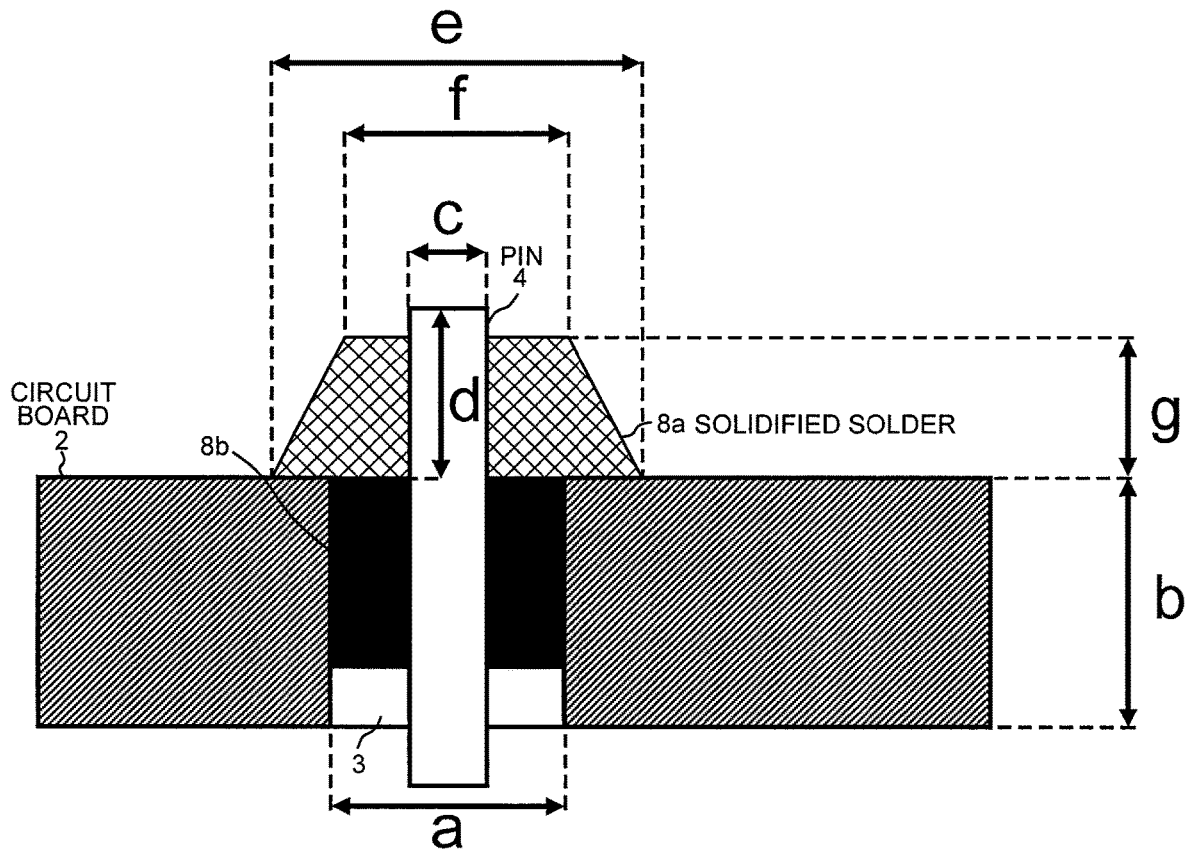
FIG. 4 schematically shows the definition of size parameters of the through hole, the pin and a conical frustum of solidified solder outside the through hole.

FIG. 4 shows the definition of parameters of the through hole 3, the pin 4 and the solidified solder 8a outside the through hole 3. In particular, it has been found by the inventors that the solidified solder 8a can be approximately considered as a conical frustum. In case a height d of the pin above the circuit board 2 is smaller than a height g of the solidified solder 8a, the solidified solder 8a has the shape of a cone.

Further, the inventors have found that ratios of different parameters shown in FIG. 4 should be within the ranges stated in the table of FIG. 10 in order to achieve a good result, i.e., a filling degree equal to or larger than 70%.

As indicated in the table of FIG. 10, the ratio of the diameter a of the through hole 3 to the depth b of the through hole 3 should be in the range of 0.5 to 3.0. Preferably, the above ratio should be 1. In addition, the diameter a of the through hole 3 should be 1.5 times to 3.0 times the diameter c of the pin 4. Preferably, the diameter a of the through hole 3 should be 2 times the diameter c of the pin 4. Furthermore, the height d of the pin 3 above the surface of the circuit board 2 should be 0 or equal to or less than 0.5 times the diameter a of the through hole 3. Moreover, the diameter e of the base of the solder 8a outside the through hole 3 should be 1.5 times to 2.0 times the diameter a of the through hole 3. Most preferably, the filling degree of the through hole 3 after soldering should be equal to or larger than 0.7 times the volume of the annular gap 16 formed between the pin 4 and the through hole 3. By setting the above ratios the solidified solder 8 between the pin 4 and the through hole 3 enables a proper mechanical joint and provides a good electrical connection.

As mentioned above, the control unit and the 3D scanner 12 or the interferometer 13 measure the volume of the solidified solder 8a outside the through hole 3, i.e., the dimensions of the conical frustum or the cone. The dimensions of the pin 4 and the through hole 3 are known from the specifications of the electronic component 1 and the circuit board 2. Therefore, the control unit is able to calculate the filling degree of the annular gap 16 by performing the following calculations.

In particular, the volume Vic of the conical frustum can be calculated by Equation (1). It is to be noted that f in Equation (1) is 0 in case the height d of the pin 4 above the circuit board 2 is smaller than the height g of the solidified solder 8a outside the through hole 3 so that Equation (1) then corresponds to the equation for calculating a volume of a cone. It is to be noted that the conical frustum is just an example in the following, and the volume of the solder 8a outside the annular gap 16 may be determined using three-dimensional image processing instead:

$$V_{fc} = (g \cdot \Pi)/3 \cdot (e^2 + e \cdot f + f^2) \quad \text{Equation (1)}$$

The volume $V_{pin}$ of the pin 4 above the circuit board 2 can be calculated by Equation (2). It is to be noted that the pin 4 is considered as a cylinder in the following. For other geometries of the pin 4, the volume of the pin 4 above the circuit board 2 needs to be calculated accordingly:

$$V_{pin} = c^2/4 \cdot \Pi \cdot d \quad \text{Equation (2)}$$

By subtracting the volume $V_{pin}$ of the pin 4 above the circuit board 2 from the volume $V_{fc}$ of the conical frustum, the volume $V_{so}$ of the solidified solder 8a outside the through hole 3 can be calculated by using Equation (3).

$$V_{so} = V_{fc} - V_{pin} \quad \text{Equation (3)}$$

As the volume of the solid solder ball and, thus, the volume $V_{sb}$ of the liquefied solder ball 5 is previously known, the volume $V_{si}$ of the solidified solder 8b inside the annular gap 16 can be calculated by using Equation (4):

$$V_{si} = V_{sb} - V_{so} \quad \text{Equation (4)}$$

Further, the volume $V_{ag}$ of the annular gap 16 can be calculated by the following Equation (5). Again, the pin 4 is considered as a cylinder:

$$V_{ag} = \Pi \cdot b \cdot (a^2 - c^2) \quad \text{Equation (5)}$$

Finally, the filling degree F. is calculated by dividing the volume of the annular gap $V_{ag}$ by the volume $V_{si}$ of the solidified solder 8b inside the through hole 3, as shown by Equation (6):

$$F = V_{si}/V_{ag} \quad \text{Equation (6)}$$

It is to be noted that liquefied solder may flow out of the annular gap 16 on the side that is opposite to the side from which the liquefied solder ball 5 has been applied. In that case, a value above 100% may be calculated as the filling degree F. However, the filling degree F. is then considered as 100%.

FIG. 5 shows an apparatus according to a third embodiment of the present disclosure. The apparatus shown in FIG. 3 is different from the apparatus according to the first embodiment shown in FIG. 1 in that the capillary 6 is arranged at an oblique angle α with respect to the surface of the circuit board 2. Therefore, the liquefied solder ball 5 is applied in the oblique angle α. In FIG. 5, the oblique angle α is 45°. However, the oblique angle α is not limited to this angle and should be within a range of 30° to 60° with respect to the surface of the circuit board 2. This embodiment provides the effect that the liquefied solder ball 5 can be applied to a spot where the pin 4 exits the through hole such that it appropriately flows into and fills the annular gap 16. As a result, a high filling degree of the annular gap 16 can be achieved.

Figure 6:
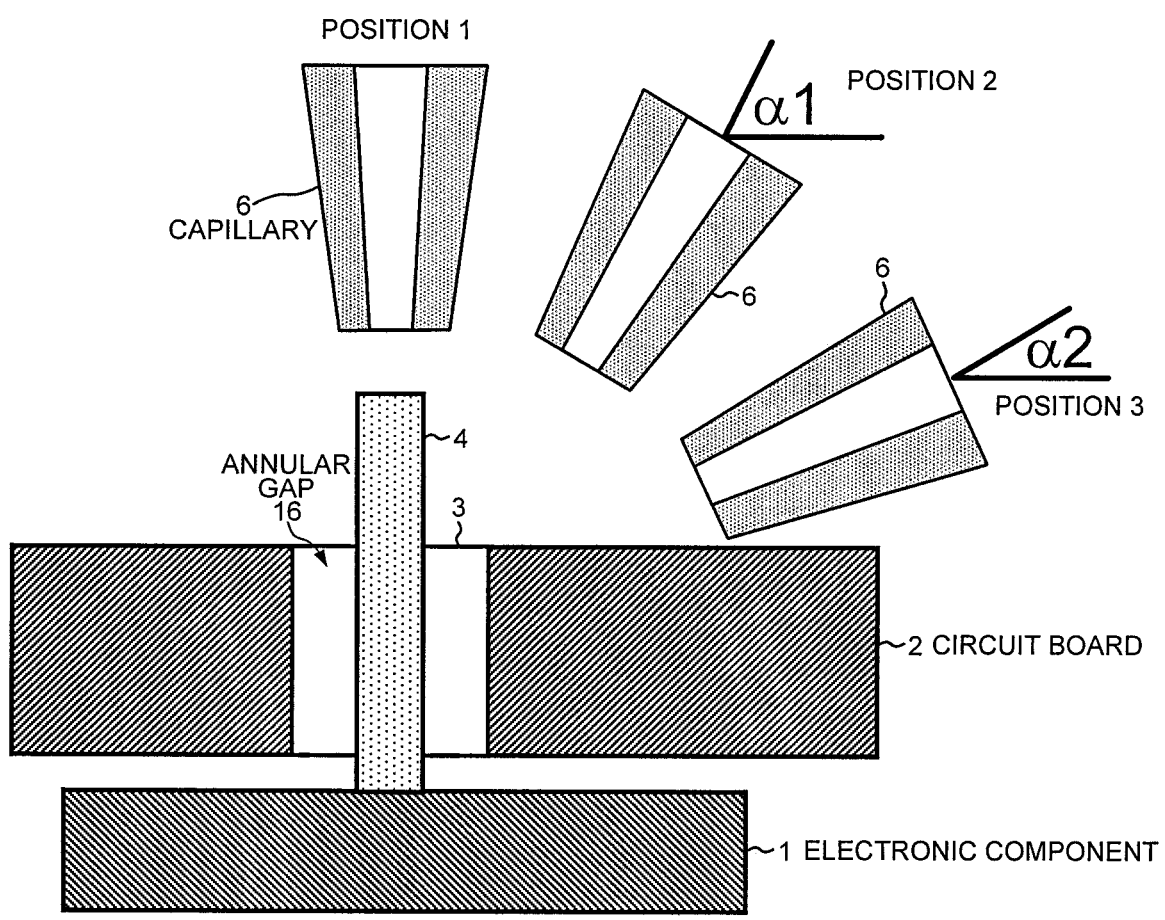
FIG. 6 schematically shows a modification of the apparatus according to the third embodiment which enables to change the angle of the capillary with respect to the circuit board.

FIG. 6 shows a modification of the third embodiment in which the capillary 6 is inclined by using the drive unit controlled by the control unit. As a result, the capillary 6 can be inclined depending on the spot to be soldered. In FIG. 6, in Position 1 the capillary 6 is directed perpendicularly towards the circuit board 2. In Position 2 and Position 3, the capillary is inclined by an angle α1 and an angle α2, respectively. In particular, the inclination of the capillary 6 in different angles is important when the side from which the liquefied solder ball 5 is applied onto the circuit board 2 is already packed with electronic components, such as SMDs. In addition, as the present disclosure may be used for mixed packed circuit boards, changing of the application angle may be required in order to solder other electronic components, such as SMDs, to the circuit board. As a result, the present embodiment enables to properly join the pin 4 and the through hole 3 and to easily pack mixed-packed circuit boards.

Figure 7:
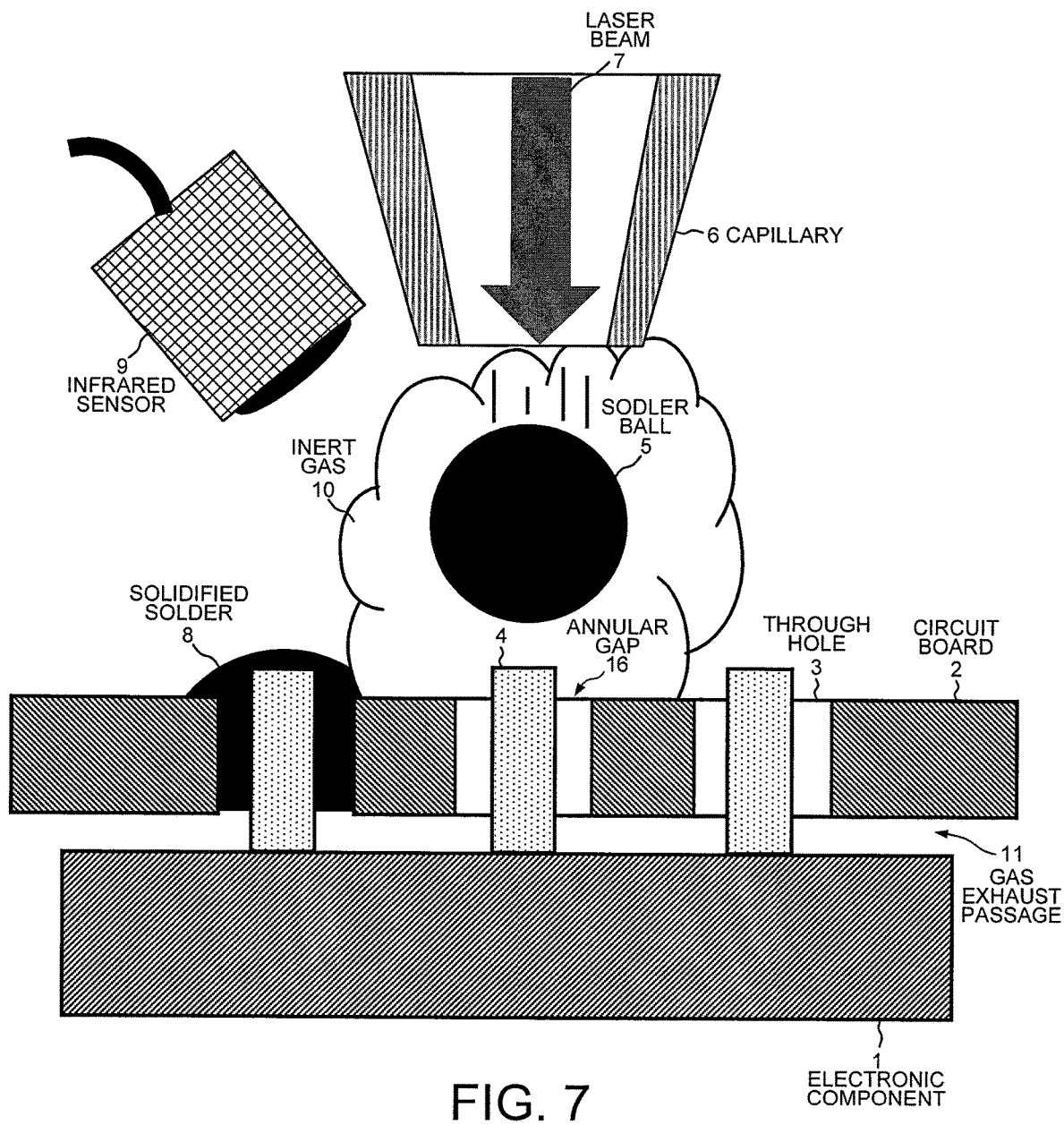
FIG. 7 schematically shows an apparatus according to a fourth embodiment of the present disclosure in which a gap between the circuit board and the electronic component is formed.

FIG. 7 shows an apparatus according to a fourth embodiment of the present disclosure. The apparatus shown in FIG. 7 is different from the apparatus shown in FIG. 1 in that the electronic component 1 and the circuit board 2 are distanced from each other so that a gas exhaust passage 11 is formed between the electronic component 1 and the circuit board 2. Therefore, when the liquefied solder ball 5 arrives at the through hole 3, the gas present inside the annular gap 16, i.e., the inert gas 10 or air, can exit on the opposite side, i.e., the lower side in FIG. 7, of the circuit board 2. As a result, a resistance for the liquefied solder ball 5 when flowing into the annular gap 16 is reduced such that proper filling of the annular gap 16 is ensured. In order to form the gas exhaust passage 11, the holding unit may be adapted to hold the electronic component 1 and the circuit board 2 distanced from each other. Alternatively or additionally, one or more spacers may be arranged between the electronic component 1 and the circuit board 2. It needs to be noted that the fourth embodiment is shown with a capillary 6 according to the first embodiment that is not inclined with respect to the surface of the circuit board 2. But the fourth embodiment may be also combined with the third embodiment in which the capillary 6 is inclined with respect to the surface of the circuit board 2 by a fixed or variable angle.

Figure 8:
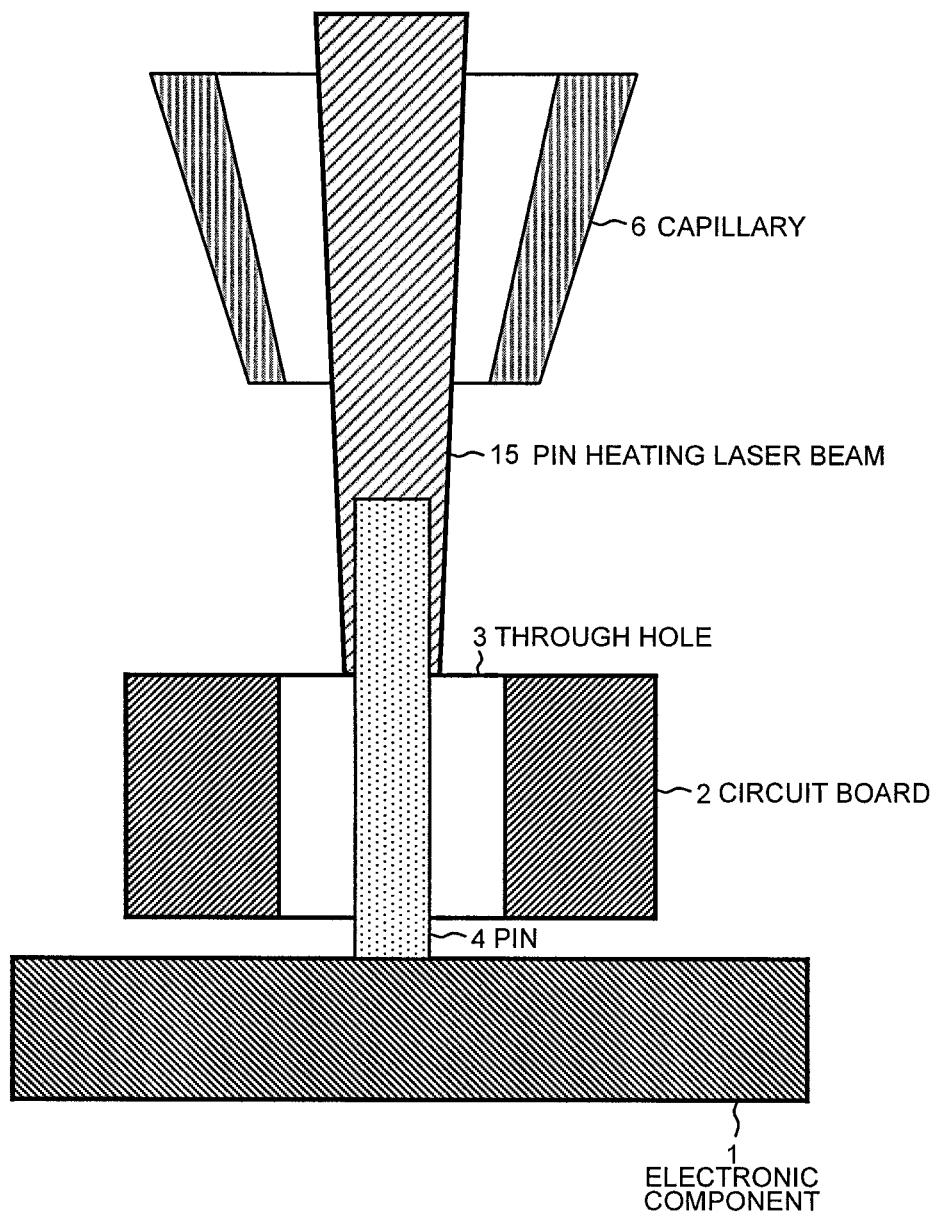
FIG. 8 schematically shows an apparatus according to a fifth embodiment of the present disclosure, which includes a pin heating laser beam for heating the pin.

FIG. 8 shows a fifth embodiment of the present disclosure. As mentioned in the description of the first embodiment, the circuit board 2 may be heated by using a heating unit. Alternatively or additionally, the apparatus according to the fifth embodiment may include a pin heating unit. As shown in FIG. 8, the pin heating unit is formed by a pin heating laser beam 15, which is different than the laser beam 7 used for liquefying the solid solder ball in order to produce the liquefied solder ball 5. Preferably, the pin heating laser beam 15 is guided through the capillary 6 and is directed onto the pin 4. For this reason, the pin heating laser beam 15 can have a smaller diameter than the laser beam 7. In addition, the pin heating laser beam 15 has a wavelength that is different than that of the laser beam 7 and that is adapted to an absorption characteristic of the pin 4, i.e., the material of the pin 4. In particular, the pin heating laser beam 15 is a blue laser beam, and the wavelength of the pin heating laser beam 15 is about 450 nm. However, the pin laser beam may also have a larger wavelength of up to 475 nm. By heating the pin 4 before application of the liquefied solder ball 5, the solidification of the liquefied solder, in particular the solidification of the solder flowing into the annular gap 16, is delayed such that a larger portion flows into and fills the annular gap 16 between the pin 4 and the through hole 3. In this way, a higher filling degree and a better joint between the pin 4 and the through hole 3 can be achieved. It needs to be noted that the laser beam 7 may also be used for heating the pin 4. However, as the wavelength of the laser beam 7 is not adapted to the pin 4, a longer time may be required for heating the pin 4.

Furthermore, the above embodiment is not limited to applying the pin heating laser beam 15 to the pin before application of the liquefied solder ball 5. In case the pin 4 has a higher height than the height of the solder 8a outside the through hole 3, the pin heating laser beam 15 may also be applied to the pin 4 after the liquefied solder ball 5 has arrived on the circuit board 2, and a portion of the liquefied solder is already jetted into the annular gap 16.

According to the fifth embodiment, the duration during which the pin 4 is heated may be determined in advance. The duration may be for example determined by experiments. In this way, overheating of the pin 4 or the electronic component 1 connected to the pin can be avoided.

Furthermore, the fifth embodiment may be combined with the first embodiment including the infrared sensor 9 as the temperature measuring unit. The infrared sensor 9 may then be adapted to additionally measure the temperature of the pin 4 during heating. A temperature threshold for the pin 4 may be predetermined and stored in the control unit. The control unit may be adapted to compare the temperature threshold with the temperature value acquired from the infrared sensor 9. In case the control unit receives a temperature value from the temperature measuring unit that exceeds the temperature threshold, the control unit may stop the heating of the pin 4 by switching off the pin heating laser beam 15.

Figure 9:
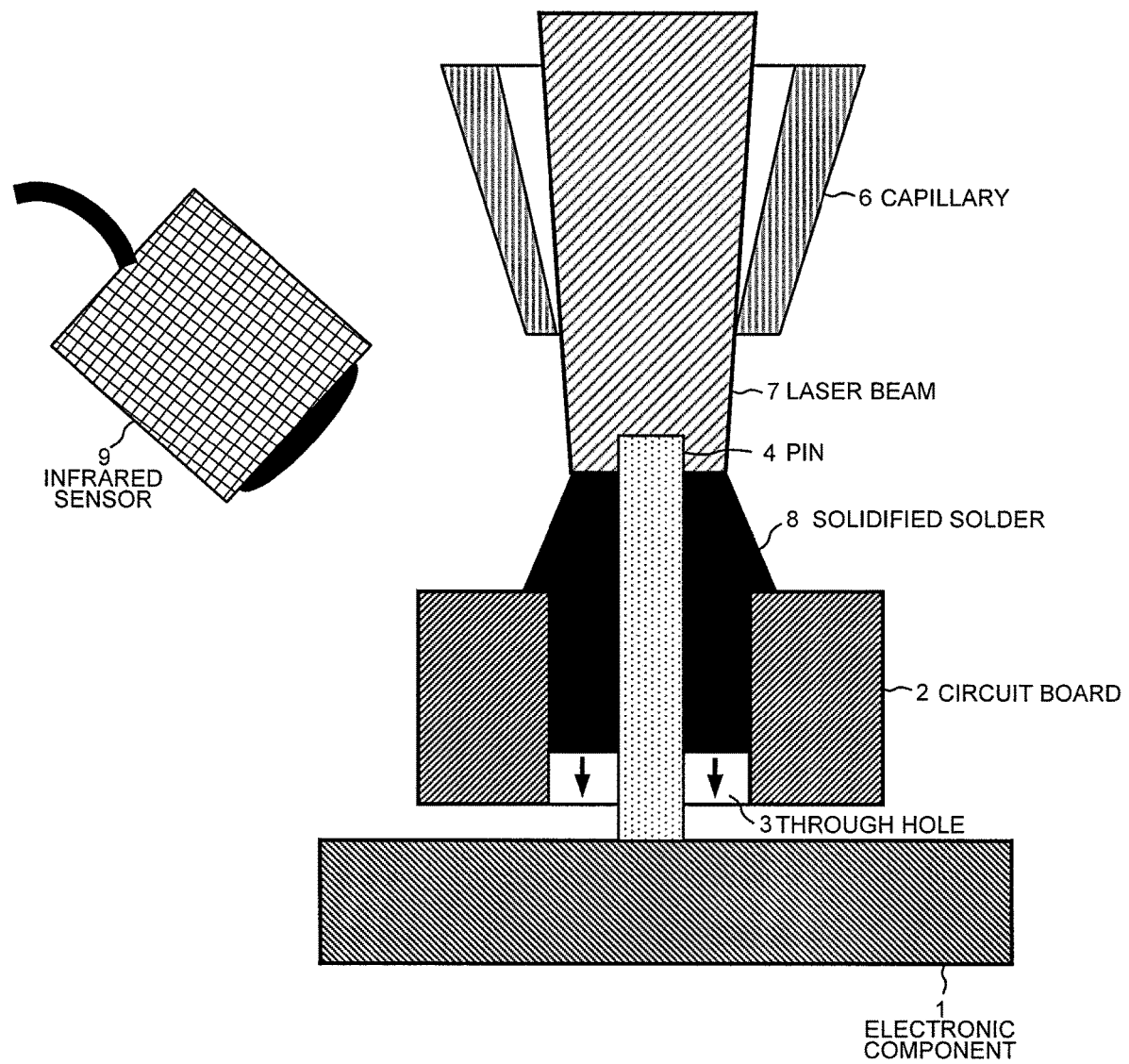
FIG. 9 schematically shows an apparatus according to a sixth embodiment of the present disclosure emitting a laser beam after liquefied solder has arrived on the circuit board and is jetted into the annular gap.

FIG. 9 shows a sixth embodiment of the present disclosure in which the laser beam 7 is applied to the solder 8 which has arrived on the circuit board 2, and a portion of which is already jetted into the annular gap 16. The time of arrival on the surface of the circuit board 2 may be calculated or may be determined experientially depending on the distance of the capillary 6 from the surface of the circuit board 2 and the pressure inside the capillary 6. Alternatively, the time of arrival may be detected by means of image recognition.

By applying the laser beam 7 after the arrival on the circuit board 2, the solder 8 is kept liquefied such that it further flows into the annular gap 16, as indicated by the arrows in FIG. 9. As the pin 4 may protrude from the solder 8 outside the annular gap 16, the pin 4 can be also heated by the laser beam 7. Preferably, the temperature of the solder 8 is measured by using the infrared sensor 9, and the application of the laser beam 7 is stopped by the control unit in case the temperature of the solder exceeds a predetermined threshold. Alternatively, the laser beam 7 may be applied for a predetermined time, which has been determined in advance, for example by carrying out experiments. In this way, burning of the solder 8 can be avoided. In summary, the sixth embodiment enables to achieve a higher filling degree of the annular gap 16 since the solder is kept liquefied after arrival on the circuit board.

Moreover, the fifth embodiment and the sixth embodiment may be combined. Therefore, the pin 4 is pre-heated by using the pin heating laser beam 15, and the solder 8 is kept liquefied after arrival of the liquefied solder ball 5 on the circuit board 2. In addition, the laser beam 7 and the pin heating laser beam 15 may be applied simultaneously after arrival of the liquefied solder ball 5 on the circuit board in case the height of the pin 4 is higher than the height of the solder 8a outside the through hole. Most preferably, the pin heating laser beam 15 is then concentrated on the pin 4.

The first to the sixth embodiments have been described above. It is to be noted that the different embodiments may be combined. For example, the first embodiment may be combined with the second embodiment, the fourth embodiment, the fifth embodiment and the sixth embodiment. Further, the third embodiment may be combined with the second embodiment, the fourth embodiment, the fifth embodiment and the sixth embodiment.

LIST OF REFERENCE NUMBERS

1 electronic component
2 circuit board
3 through hole
4 pin
5 liquefied solder ball
6 capillary
7 laser beam
8 solder
8a solder outside the through hole
8b solder inside the through hole
9 infrared sensor
10 inert gas
11 gas exhaust passage
12 3D scanner
13 interferometer
14 measuring beam
15 pin heating laser beam
16 annular gap
a diameter of through hole
b depth of through hole
c diameter of pin
d height of pin above circuit board
e diameter of base of conical frustum
f diameter of top of conical frustum
g height of conical frustum Although the present invention has been described in connection with certain specific embodiments for instructional purposes, the present invention is not limited thereto. Accordingly, various modifications, adaptations, and combinations of various features of the described embodiments can be practiced without departing from the scope of the invention as set forth in the claims.

What is claimed is:

1. An apparatus for soldering an electronic component to a circuit board, comprising:
   a capillary that constricts towards its outlet;
   an electromechanical device adapted to direct the capillary towards a through hole in the circuit board;
   a first laser adapted to supply energy to a solid solder ball in the capillary so as to produce a liquefied solder ball, wherein an inner diameter of the outlet of the capillary is smaller than a diameter of the solid solder ball, and wherein the liquefied solder ball is jetted towards the through hole when a pressurized gas is supplied into the capillary; and
   an image processor adapted to determine a volume of the liquefied solder ball that remains outside the through hole after the liquefied solder ball is jetted towards the through hole and a portion flows into the through hole, wherein the apparatus determines a filling degree of the through hole based on how much of the liquefied solder ball remains outside the through hole and on a predetermined total volume of the liquefied solder ball before the liquefied solder ball is jetted.

2. The apparatus of claim 1, wherein the liquefied solder ball is jetted towards the through hole from a first side of the circuit board that is opposite to a second side of the circuit board onto which the electronic component is mounted.

3. The apparatus of claim 1, wherein the first laser emits a laser beam axially through the capillary.

4. The apparatus of claim 1, further comprising:
   an infrared temperature sensor adapted to measure a temperature of the liquefied solder ball, wherein the apparatus stops the first laser from supplying energy when the temperature of the liquefied solder ball exceeds an upper temperature threshold, and wherein the apparatus restarts the supplying of energy when the temperature of the liquefied solder ball falls below a lower temperature threshold.

5. The apparatus of claim 1, further comprising:
   a second laser adapted to supply energy to a pin of the electronic component that protrudes through the through hole so as to heat the pin, wherein the first laser emits light having a wavelength that is different than that of the light emitted by the second laser, and wherein the wavelength of the light emitted by the second laser is matched to an absorption characteristic of the pin.

6. The apparatus of claim 1, wherein the circuit board has a back surface, wherein the electromechanical device is adapted to direct the capillary towards the through hole at an angle relative to the back surface, and wherein the angle is 30° to 60°.

7. The apparatus of claim 1, wherein the apparatus is adapted to heat the circuit board to a temperature of 60° C. to 90° C. before the liquefied solder ball is jetted towards the through hole.

8. The apparatus of claim 1, wherein the solid solder ball has a diameter of 0.8 mm to 2.0 mm, and wherein the diameter of the solid solder ball is 1.0 to 1.4 of the diameter of the through hole.

9. An apparatus for soldering an electronic component to a circuit board, comprising:
   a capillary that constricts towards its outlet;
   an electromechanical device adapted to direct the capillary towards a through hole in the circuit board;

a first laser adapted to supply energy to a solid solder ball in the capillary so as to produce a liquefied solder ball, wherein an inner diameter of the outlet of the capillary is smaller than a diameter of the solid solder ball, wherein when a pressurized gas is supplied into the capillary the liquefied solder ball is jetted towards an annular gap between a pin and sides of the through hole, wherein the pin is attached to the electronic component and passes through the through hole in the circuit board; and an image processor adapted to determine how much of the liquefied solder ball remains outside the through hole after a portion of the liquefied solder ball has flowed into the annular gap, wherein the apparatus determines a filling degree of the through hole based on how much of the liquefied solder ball remains outside the through hole and on a predetermined total volume of the liquefied solder ball before the liquefied solder ball is jetted towards the annular gap.

10. The apparatus of claim 9, wherein the liquefied solder ball is jetted towards the annular gap from a first side of the circuit board that is opposite to a second side of the circuit board onto which the electronic component is mounted.

11. The apparatus of claim 9, wherein the first laser emits a laser beam axially through the capillary.

12. The apparatus of claim 9, further comprising:
an infrared temperature sensor adapted to measure a temperature of the liquefied solder ball, wherein the apparatus stops the first laser from supplying energy when the temperature of the liquefied solder ball exceeds an upper temperature threshold, and wherein the apparatus restarts the supplying of energy when the temperature of the liquefied solder ball falls below a lower temperature threshold.

13. The apparatus of claim 9, further comprising:
a second laser adapted to supply energy to the pin so as to heat the pin, wherein the first laser emits light having a wavelength that is different than that of the light emitted by the second laser, and wherein the wavelength of the light emitted by the second laser is matched to an absorption characteristic of the pin.

14. The apparatus of claim 9, wherein the circuit board has a back surface, and wherein the electromechanical device is adapted to direct the capillary towards the through hole at an angle relative to the back surface, and wherein the angle is 30° to 60°.

15. The apparatus of claim 9, wherein the apparatus is adapted to heat the circuit board to a temperature of 60° C. to 90° C. before the liquefied solder ball is jetted towards the annular gap.

16. The apparatus of claim 9, wherein the solid solder ball has a diameter of 0.8 mm to 2.0 mm, and wherein the diameter of the solid solder ball is 1.0 to 1.4 of the diameter of the through hole.

17. An apparatus for soldering an electronic component to a circuit board, comprising:
a capillary that constricts towards its outlet;
an electromechanical device adapted to direct the capillary towards a through hole in the circuit board;
a first laser adapted to supply energy to a solid solder ball in the capillary so as to produce a liquefied solder ball, wherein an inner diameter of the outlet of the capillary is smaller than a diameter of the solid solder ball, wherein when a pressurized gas is supplied into the capillary the liquefied solder ball is jetted towards an annular gap between a pin and sides of the through hole, wherein the pin is attached to the electronic component and passes through the through hole in the circuit board; and
a second laser adapted to supply energy to the pin so as to heat the pin, wherein the first laser emits light having a wavelength that is different than that of the light emitted by the second laser, and wherein the wavelength of the light emitted by the second laser is matched to an absorption characteristic of the pin.

18. The apparatus of claim 17, further comprising:
an image processor adapted to determine how much of the liquefied solder ball remains outside the through hole after the liquefied solder ball is jetted towards the annular gap and a portion flows into the through hole, wherein the apparatus determines a filling degree of the through hole based on how much of the liquefied solder ball remains outside the through hole and on a predetermined total volume of the liquefied solder ball before the liquefied solder ball is jetted.

19. The apparatus of claim 17, further comprising:
an infrared temperature sensor adapted to measure a temperature of the liquefied solder ball, wherein the apparatus stops the first laser from supplying energy when the temperature of the liquefied solder ball exceeds an upper temperature threshold, and wherein the apparatus restarts the supplying of energy when the temperature of the liquefied solder ball falls below a lower temperature threshold.

20. The apparatus of claim 17, wherein the apparatus is adapted to heat the circuit board to a temperature of 60° C. to 90° C. before the liquefied solder ball is jetted towards the annular gap.

* * * * *